US008536629B2

(12) United States Patent
Tada et al.

(10) Patent No.: US 8,536,629 B2
(45) Date of Patent: Sep. 17, 2013

(54) SEMICONDUCTOR DEVICE AND METHOD FOR MANUFACTURING THE SAME

(75) Inventors: Munehiro Tada, Minato-ku (JP); Hiromitsu Hada, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/202,687

(22) PCT Filed: Jan. 14, 2010

(86) PCT No.: PCT/JP2010/050332
§ 371 (c)(1),
(2), (4) Date: Aug. 22, 2011

(87) PCT Pub. No.: WO2010/098151
PCT Pub. Date: Sep. 2, 2010

(65) Prior Publication Data
US 2011/0298021 A1    Dec. 8, 2011

(30) Foreign Application Priority Data
Feb. 24, 2009  (JP) .................................. 2009-040965

(51) Int. Cl.
*H01L 29/772* (2006.01)
*H01L 21/762* (2006.01)

(52) U.S. Cl.
USPC ............ 257/288; 257/E21.568; 257/E29.242; 438/458

(58) Field of Classification Search
USPC ........... 257/288, E21.568, E29.242; 438/458
See application file for complete search history.

(56) References Cited

U.S. PATENT DOCUMENTS

| | | |
|---|---|---|
| 6,570,221 B1 | 5/2003 | Allman |
| 2006/0170046 A1 | 8/2006 | Hara |
| 2006/0284167 A1 | 12/2006 | Augustine et al. |
| 2008/0090380 A1 | 4/2008 | Gardner et al. |
| 2008/0315351 A1 | 12/2008 | Kakehata |

FOREIGN PATENT DOCUMENTS

| | | |
|---|---|---|
| JP | 05-211128 A | 8/1993 |
| JP | 3048201 B2 | 8/1993 |
| JP | 07-153929 A | 6/1995 |
| JP | 2001-160612 A | 6/2001 |
| JP | 2004-140381 A | 5/2004 |
| JP | 2004-289105 A | 10/2004 |
| JP | 2005-045036 A | 2/2005 |
| JP | 2006-134979 A | 5/2006 |
| JP | 2006-210828 A | 8/2006 |
| JP | 2007-194349 A | 8/2007 |
| JP | 2008-532313 A | 8/2008 |
| JP | 2009-501434 A | 1/2009 |
| JP | 2009-027150 A | 2/2009 |

OTHER PUBLICATIONS

Hideki Takagi, et al., "Transmission Electron Microscope Observations of Si/Si Interface Bonded at Room Temperature by Ar Beam Surface Activation", Jpn. J. Appl. Phys., Mar. 1999, pp. 1589-1594, vol. 38, Part 1, No. 3A.

*Primary Examiner* — Victor A Mandala
*Assistant Examiner* — Whitney T Moore
(74) *Attorney, Agent, or Firm* — Sughrue Mion, PLLC

(57) ABSTRACT

A method for manufacturing a semiconductor device, includes: forming an insulating film containing silicon, oxygen and carbon on at least one of a first substrate and a second substrate; and bonding the first substrate and the second substrate together, with the insulating film interposed therebetween. There can be provided a method capable of manufacturing a semiconductor device having high element density, high performance and high reliability, with high yield.

35 Claims, 11 Drawing Sheets

FIG. 8
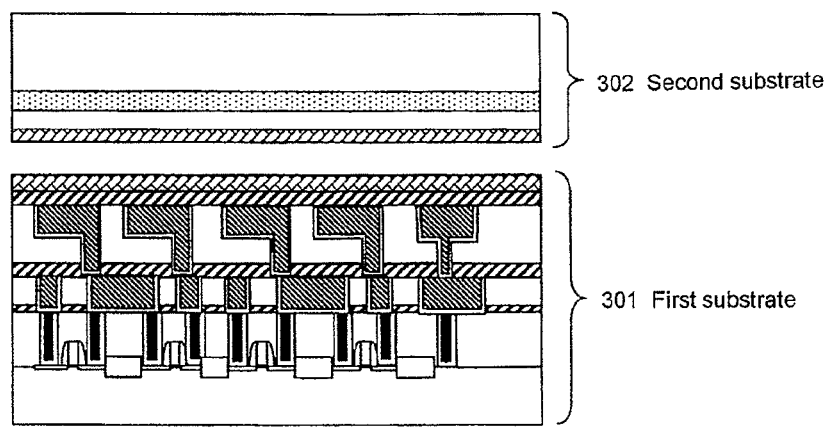
(a)
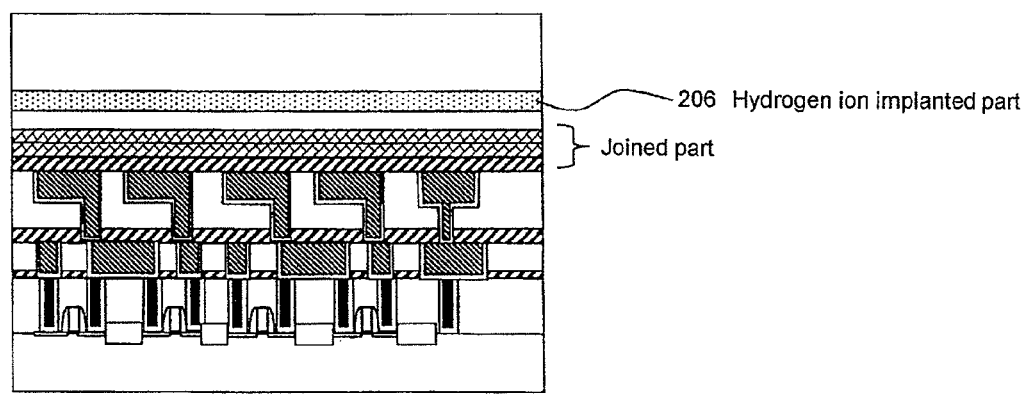
(b)

SEMICONDUCTOR DEVICE AND METHOD FOR MANUFACTURING THE SAME

CROSS REFERENCE TO RELATED APPLICATION

This application is a National Stage of International Application No. PCT/JP2010/050332 filed Jan. 14, 2010, claiming priority based on Japanese Patent Application No. 2009-040965 filed Jan. 24, 2009, the contents of all of which are incorporated herein by reference in their entirety.

TECHNICAL FIELD

The present invention relates to a semiconductor device and a method for manufacturing the same. In particular, the present invention relates to a semiconductor device to which a bonding technique of substrates is applied, and a method for manufacturing the same.

BACKGROUND ART

In a semiconductor device (particularly, a silicon device), higher integration and lower power consumption have been achieved by miniaturization based on the scaling law (Moore's law). The development of the semiconductor device has been advanced at a pace of 4 times per three years. In recent years, the gate length of a MOSFET has been 20 nm or less, which causes a rising cost of a lithography process (soaring cost of a device and a mask set) or physical limits (operating limits and variation limits) of a device size. Therefore, improvement in device performance caused by an approach different from the miniaturization based on the conventional scaling law is required.

In recent years, a three-dimensional technique has been examined as a technique for adding a new function or increasing the number of elements utilizing the upper space of a semiconductor element. Examples of the three-dimensional (3D) technique include a technique of bonding chips together (Chip to Chip) and a technique of bonding device wafers together (Wafer to Wafer).

When one-generation scaling is advanced, device density is doubled. In order to correspond to the doubled device density, hitherto, scaling by lithography was overwhelmingly superior to the formation of a second-layer transistor in cost. Therefore, the three-dimensional formation of the chip (device) having the same function did not become widely used. However, the demand of the three-dimensional formation increases with the stagnation or blunting of miniaturization.

However, yield is fundamentally managed on a wafer level in the production of the semiconductor device. Therefore, when the above-mentioned 3D technique is used, there is a problem that the yield is remarkably reduced whenever a device wafer or a chip is stacked. Particularly, in a device wafer stack type 3D formation process, wafer alignment and the formation process of a penetration electrode having a high aspect are required. However, the 3D formation process was hardly developed on extension of a ULSI process because of the difference of the order of a processing size. In order to join wafers having a thickness of tens of micrometers by a penetration electrode, a via diameter is required to be at least about 2 μm because of the problem of the embeddability of an electrode. Thus, the size of the penetration electrode (penetration via) is greater by one figure than the ULSI process. Therefore, there is a problem that sufficient via density cannot be obtained and the advantage of the 3D formation cannot be sufficiently exhibited in chip performance.

On the other hand, a technique of transferring a silicon thin film (particularly, a single-crystal silicon thin film) to the other substrate from one substrate is known as a so-called "bonding technique".

A method using an adhesive material (adhesive layer) and a method using no adhesive material (adhesive layer) exist in bonding substrates together.

A method for subjecting the principal surface of a silicon substrate or the surface of a supporting substrate to a surface activation treatment such as a plasma treatment, an ion beam treatment or an ozone treatment to press-bond the substrates is known as a method for bonding substrates together without using an adhesive material. The following method is described as a method for manufacturing a SOI (silicon on insulator) substrate in Patent Literature 1 (JP2007-194349A). The method includes heating the peripheral part of a substrate having a hydrophilized silicon surface to hydrophobize the peripheral part, press-bonding the silicon surface and the hydrophilized silicon surface of the other substrate, and conducting a heat treatment at 800 to 1000° C. In these methods, a surface treatment, a heat treatment and the like before joining are variously devised. However, a heat treatment of about 1000° C. after joining is generally required in order to finally secure adhesive strength. As an approach of bonding silicon substrates together, the following method is described in Non-Patent Literature 1. The method includes irradiating the silicon substrates with an Ar atom beam to activate the silicon surfaces, and bonding the silicon substrates can be bonded together.

A method for heating-adhering substrates using an epoxy, acrylate or silicone resin materials or the like as an adhesive is known as a method using an adhesive material for bonding substrates together.

As an example of the "bonding" technique, the following method is described in Patent Literature 2 (JP2004-140381A). The method includes forming a thin film device layer on a translucent substrate with an intervention of a separation layer made of amorphous silicon, a metal, and the like interposed therebetween, and bonding the thin film device layer and the other substrate together, with an adhesive layer interposed therebetween. The method further includes irradiating the bonded substrates with light from the translucent substrate side to generate delamination (in-layer delamination and interfacial delamination) in the separation layer, and separating the translucent substrate from the other substrate including the thin film device layer with the separation layer as a base point. Thus, the thin film device layer provided on the translucent substrate is transferred to the other substrate.

The following method is described in Patent Literature 3 (JP05-211128A). The method includes delaminating a silicon substrate from a substrate in which the silicon substrate and a supporting substrate (stiffening material) are joined together such that a thin silicon film (a joined surface side portion of a silicon substrate) leaves on the supporting substrate. Specifically, a hydrogen ion is implanted into the bonded surface side of the silicon substrate before bonding. The silicon substrate and the supporting substrate are then bonded together, and the substrates are heated at a temperature exceeding 500° C. The silicon thin film supported by the supporting substrate is delaminated from the silicon substrate by utilizing the evolution of hydrogen bubbles in the silicon substrate by the heating. A method for implanting a hydrogen ion to delaminate (transfer) a silicon thin film is known as Smart-Cut™ method by SOITEC Corporation (or SOITEC method).

As a method for forming a semiconductor crystal film on a substrate without using the "bonding" technique, the following method is described in Patent Literature 4 (JP2005-45036A). The method includes forming an insulating film on a substrate, introducing an impurity element into the insulating film so that a concentration gradient is made in the insulating film, forming a non-single crystal film on the insulating film, and irradiating the non-single crystal film with an energy beam to fuse and solidify the non-single crystal film, thereby crystallizing the non-single crystal film. In the method, a gradual temperature gradient is formed in the surface of the film by the difference in a thermal conductivity according to the concentration gradient of the impurity element, during the irradiation of the energy beam. Thereby, the crystal can be grown in a low crystallization rate, and a good crystal film having great crystal grains can be formed.

CITATION LIST

Patent Literature
Patent Literature 1: JP2007-194349A
Patent Literature 2: JP2004-140381A
Patent Literature 3: JP05-211128A
Patent Literature 4: JP2005-45036A
Non-Patent Literature
Non-Patent Literature 1: Transmission Electron Microscope Observations of Si/Si Interface Bonded at Room Temperature by Ar Beam Surface Activation, Hideki TAKAGI, Ryutaro MAEDA, Naoe HOSODA, Tadatomo SUGA, Japanese Journal of Applied Physics Part 1, 38 (1999), 1589-1594

SUMMARY OF INVENTION

Technical Problem

The following problems exist when forming a transistor (3D transistor) in a multilayer wiring layer by using the silicon thin film formed by utilizing the "bonding" technique.

(1) In the "bonding" technique of the wafers using the adhesive material (adhesive layer), for example, the epoxy, acrylate and silicone adhesive materials or the like are utilized. However, since the adhesive materials generally have poor heat stability, it is difficult to use the adhesive materials for the ULSI process. In the adhesion, a reaction accelerator is often required for the curing reaction of the adhesive material, and a by-product is often generated. These deteriorate a joining state in the bonding of the substrates, to provide insufficient joining strength. Heating is usually required for the curing reaction of the adhesive material. For example, when the epoxy adhesive material is used, it is generally necessary to perform a heat treatment at 250° C. or more for curing. When the temperature of the substrate is increased to such a temperature, the warpage of the substrate is generated, which makes it difficult to obtain sufficient joining. Since the adhesive material is primarily composed of an organic component, the adhesive material cannot endure the process temperature of 350° C. in the ULSI process. When an addition type silicone adhesive material is used, a catalyst and heating are required. When a moisture curable type silicone adhesive material is used, the chemical reaction (OH reaction) of the moisture curable type silicone adhesive material and moisture in air is required at room temperature. In the addition type silicone adhesive material, a sufficient joining state is not obtained due to the catalyst or the heating. In the moisture curable type silicone adhesive material, excessive moisture for curing is generated as degas in the sealing state of the bonding interface of the substrates, and sufficient joining is not obtained. When the acrylic adhesive material is used, a heat curing treatment of about 250° C. is required as in the case where the epoxy adhesive material is used, and heat resistance is also insufficient.

(2) In the "bonding" technique using no adhesive material (adhesive layer), there is a method for press-bonding substrates where the substrates are subjected to the surface activation treatment such as the plasma treatment, the ion beam treatment or the ozone treatment. The method provides disadvantageously insufficient adhesive strength. When the "bonding" technique is limited to the bonding of the semiconductor single crystals, the bonding application is extremely limited. Therefore, it is desired to connect the substrate on which the device is formed to the other substrate with the insulating film such as the silicon oxide film interposed therebetween. When the surface of the silicon oxide film is subjected to the activation treatment, the formed dangling bond contributes to joining. However, the surface of such an insulating film is stable, and it is difficult to increase the density of the dangling bond.

(3) As compared with the approach using the adhesive material of the above item (1), it was unlikely that the joining strength was improved by the activation treatment in the approach of performing the activation treatment of the above item (2), in guessing from the joining reaction mechanism of the adhesive material. Moreover, there was fear that the joined part was removed by the activation treatment.

(4) In order to form the semiconductor element (3D transistor) using the silicon thin film, possible high strength joining is required at the lowest possible joining process temperature. Since the insulating film formed on the joined surface is left in the device even in the subsequent process, and is used as the interlayer insulating film, sufficient heat resistance and process resistance are required. Hitherto, a material simultaneously satisfying adhesiveness as the joining layer, heat stability in the process as the interlayer insulating film, reliability after forming the device, and low-dielectric characteristics has not been found.

(5) When the semiconductor element (3D transistor) is formed by using the silicon thin film, the interlayer insulating film which is the joining layer plays the same role as that of a BOX (buried oxide) film in a so-called SOI device to the semiconductor element. When such a structure is formed in the multilayer wiring structure, it is desirable to improve the element performance by reducing the dielectric constant of the interlayer insulating film that is between the semiconductor element and the lower-layer side wiring, and thus reducing the parasitic capacitance therebetween.

It is an object of the present invention to provide a semiconductor device having high element density, high performance and high reliability, and a method capable of manufacturing such a semiconductor device with high yield.

Solution to Problem

A method for manufacturing a semiconductor device in accordance with an exemplary aspect of the invention, includes:
forming an insulating film containing silicon, oxygen and carbon on at least one of a first substrate and a second substrate; and
bonding the first substrate and the second substrate together, with the insulating film interposed therebetween.

A semiconductor device in accordance with another exemplary aspect of the invention, includes:
a first semiconductor element;

a first multilayer wiring layer provided on the first semiconductor element;

an interlayer insulating film containing silicon, carbon and oxygen, the interlayer insulating film being provided on the first multilayer wiring layer; and a second semiconductor element provided on the interlayer insulating film.

Advantageous Effects of Invention

The present invention can provide a semiconductor device having high element density, high performance and high reliability, and a method capable of manufacturing such a semiconductor device with high yield.

BRIEF DESCRIPTION OF DRAWINGS

FIG. 8 is an explanatory view for explaining the method for manufacturing a semiconductor device in accordance with Example 1 of the present invention.

DESCRIPTION OF EMBODIMENTS

Figure 1:
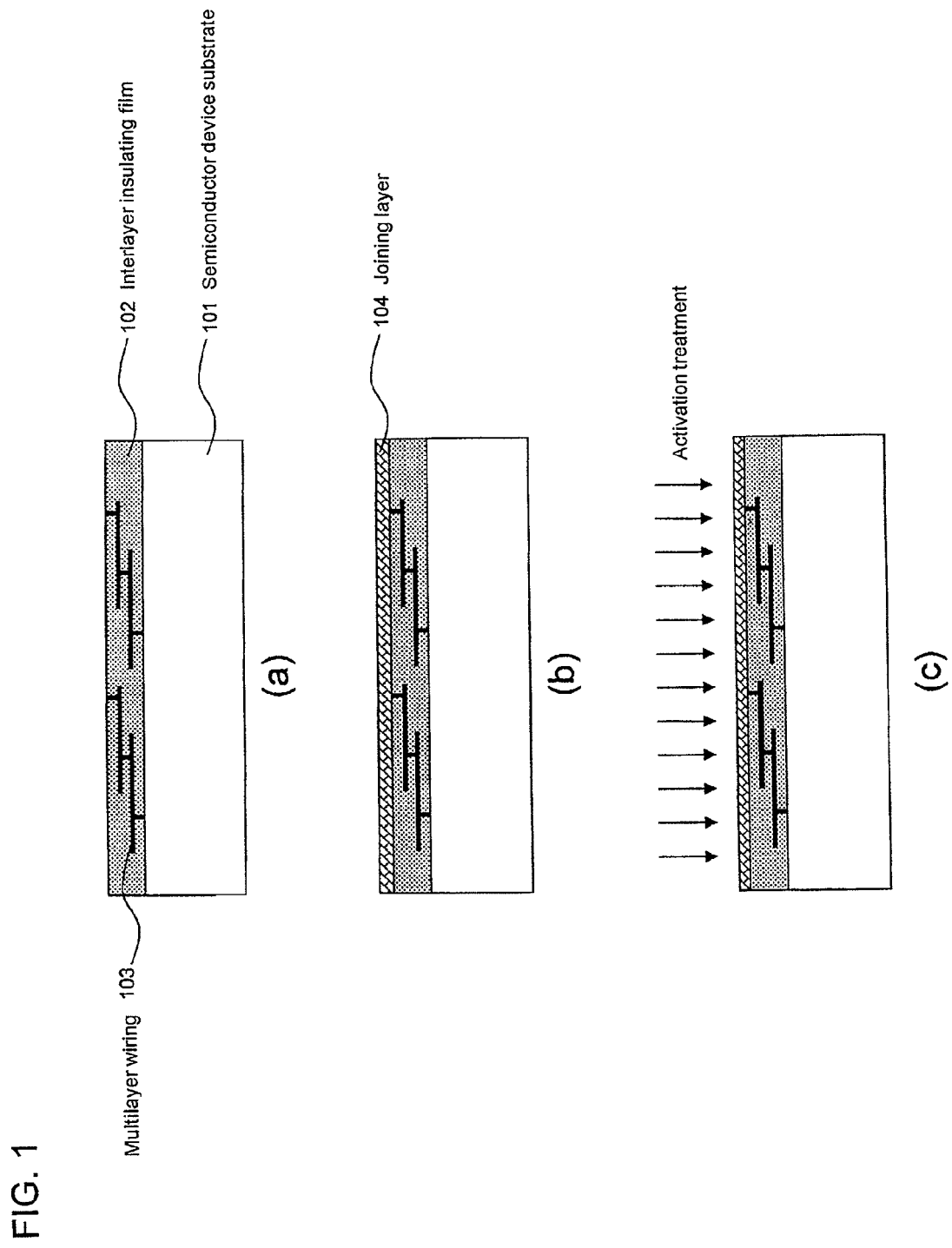
FIG. 1 is an explanatory view for explaining a method for manufacturing a semiconductor device in accordance with a first exemplary embodiment of the present invention.

Hereinafter, a suitable exemplary embodiment will be described.

In the exemplary embodiment, there is provided a structure in which a second semiconductor element is provided on a first semiconductor element using a bonding technique. When substrates are bonded together, sufficient joining strength can be obtained. After the substrates are bonded together, sufficient process resistance can be obtained. Furthermore, device performance can be improved.

In the manufacturing method in accordance with the exemplary embodiment, an insulating film (hereinafter, appropriately referred to as a "joining layer") containing silicon, oxygen and carbon is formed on at least one of a first substrate and a second substrate. The substrates are bonded together, with the insulating film interposed therebetween.

Since the method can bond the substrates together at a temperature not exceeding 200° C., the substrates can be bonded together with high strength without causing the warpage of the substrate. The use of a carbon-containing insulating film as a joining layer facilitates the formation of a dangling bond in the surface of the carbon-containing insulating film as compared with a carbon-free silicon oxide film, and thereby joining strength can be improved.

The use of the insulating film containing silicon, oxygen and carbon as the joining layer can provide heat resistance and reduce the parasitic capacitance of the element while improving the joining strength.

The joining layer is preferably made of an organic polysiloxane, and more preferably an organic polysiloxane having an unsaturated hydrocarbon group. Thereby, the density of the dangling bond in the surface can be increased to improve the joining strength. In addition, when the organic polysiloxane has the unsaturated hydrocarbon group, a polymerization reaction is generated on a bonding interface, and thereby the joining strength can be further improved.

The joining layer is preferably formed by using a plasma CVD method. For example, the joining layer can be formed at a low temperature (usually about 300° C. to about 400° C.) by the plasma CVD method as compared with the case where a thermally-oxidized film is formed at about 800° C. to about 900° C. Thereby, many silicon dangling bonds can be formed in the surface of the joining layer. The film-forming temperature of the joining layer is preferably 400° C. or less, and more preferably 350° C. or less. A raw material gas in forming the film by the plasma CVD method is preferably an organic siloxane, and more preferably an organic siloxane having an unsaturated hydrocarbon group.

The thickness of the joining layer is preferably thinner to the extent that adhesion, film-forming properties and insulation properties after joining or the like can be sufficiently secured. For example, it is preferable that the thickness after joining does not exceed 100 nm. A via connected to the second semiconductor element and a via connected to a wiring provided on a lower-layer side thereof are easily and simultaneously formed by such a thickness.

It is preferable that the joining layer provided on the first substrate and the joining layer provided on the second substrate are bonded together so that the joining layers face to each other. Even when the joining layer is provided on one substrate and the joining layer is not provided on the other substrate, sufficient joining strength can be obtained when a sufficient dangling bond exists in the surface of the other substrate on which the joining layer is not provided, by subjecting a substrate material or the surface of the substrate to an activation treatment.

Before the substrates are bonded together, the surface of the joining layer is desirably subjected to an activation treatment. The activation treatment can be performed under reduced pressure by plasma irradiation, ion beam irradiation or atom beam irradiation. The dangling bond in the surface of the joining layer can be increased by performing such an activation treatment, to improve the joining strength. The reduced pressure condition during the activation treatment can be set to 10 Pa or less, and preferably $10^{-3}$ Pa or less.

The substrates may be bonded together without applying a load (by only the weight of the substrate). However, the substrates are preferably bonded together by applying the load in view of obtaining higher joining strength. In that case, the substrates are preferably press-bonded by applying a load of 40 kN or less. Even when a load exceeding 40 kN is added, an effect corresponding to the added load is small, which may cause the deformation or the like of a multilayer wiring structure.

The substrates are preferably bonded together under reduced pressure, and more preferably under a reduced pressure of $10^{-3}$ Pa or less. A volatile component such as a water absorption component in the joining layer can be degassed by the reduced pressure, and the surface of the joining layer can be cleaned.

At least one of the first substrate and the second substrate preferably includes a semiconductor substrate or a semiconductor layer. Examples of the semiconductor substrate or the semiconductor layer include a semiconductor substrate or a semiconductor layer made of silicon, germanium or a compound semiconductor.

The first substrate preferably includes the semiconductor substrate or the semiconductor layer. In that case, a substrate including a semiconductor substrate or a semiconductor layer that is of the same kind as or of a different kind from the semiconductor substrate or the semiconductor layer of the first substrate can be used as the second substrate. The first substrate can include a semiconductor substrate or a semiconductor layer made of silicon, germanium or a compound semiconductor as the semiconductor substrate or the semiconductor layer. The second substrate can include a semiconductor layer or a semiconductor substrate made of silicon, germanium or a compound semiconductor as the semiconductor substrate or the semiconductor layer. The second semiconductor element can be formed above the first semiconductor element by using such a substrate.

The first substrate can include a semiconductor element. In that case, a single-crystal semiconductor substrate can be used as the second substrate. Thereby, a channel part of the second semiconductor element provided on the first semiconductor element can be formed by a single-crystal semiconductor. When the second semiconductor element is particularly a MOSFET, the performance thereof can be improved.

The first substrate can include a multilayer wiring layer provided on the first semiconductor element. The multilayer wiring layer can include a copper wiring. A wiring connected to the element can be highly densified by providing such a multilayer wiring layer.

In the manufacturing method in accordance with the exemplary embodiment, after bonding the first substrate and the second substrate together, the second substrate is removed with a part of the second substrate left as a semiconductor residual layer (semiconductor thin film) on the insulating film (joining layer). The second semiconductor element can be formed by using the semiconductor residual layer.

For example, before the step of bonding the first substrate and second substrate together, a hydrogen ion is implanted into the second substrate, for example, with a dose amount of $1.0 \times 10^{16}$ atoms/cm$^2$ or more, to form a hydrogen ion added layer. After bonding the first substrate and second substrate together, a heat treatment is performed to embrittle the hydrogen ion added layer. Delamination is generated in the embrittled portion, and the second substrate is separated from the delaminated portion with a bonded surface side portion left as the semiconductor residual layer (semiconductor thin film) on the insulating film (joining layer). Thereby, a second semiconductor element can be formed by using the semiconductor residual layer.

When the substrates are bonded together at a high temperature at this time, the implanted hydrogen ion generates bubbles. Hence, the substrates are desirably bonded together at a temperature not exceeding 250° C. The substrates are preferably bonded together at a temperature of 200° C. or less, to more sufficiently suppressing the generation of the bubbles and to prevent the warpage of the substrates during the bonding of the substrates. After bonding the substrates together, the hydrogen ion added layer can be embrittled by heat-treating the bonded substrates, preferably at 250 to 400° C. Delamination is generated with the embrittled hydrogen ion added layer in the second substrate as a starting point, to separate the second substrate. As a result, a part of the second substrate (semiconductor residual layer) is transferred on the joining layer provided on the first substrate.

The surface of the transferred part of the second substrate (semiconductor residual layer) can be planarized by CMP (chemical mechanical polish).

When the hydrogen ion is not implanted, the rear surface (the surface opposite to the bonded surface) of the second substrate is polished after the substrates are bonded together, to thin the second substrate. As a result, the semiconductor thin film can be left on the first substrate with the insulating film (joining layer) interposed therebetween.

Thus, the semiconductor layer (semiconductor thin film) left on the insulating film (joining layer) provided on the first substrate can be utilized for the formation of the semiconductor element.

The semiconductor device in accordance with the exemplary embodiment includes a first semiconductor element, a first multilayer wiring layer provided on the first semiconductor element, an interlayer insulating film that contains silicon, carbon and oxygen, the interlayer insulating film being provided on the first multilayer wiring layer, and a second semiconductor element provided on the interlayer insulating film.

The interlayer insulating film is preferably formed of an organic polysiloxane, and more preferably an organic polysiloxane having an unsaturated hydrocarbon group. The interlayer insulating film is preferably thinner to the extent that film-forming properties, insulation properties, and the like can be sufficiently secured. For example, it is preferable that the thickness thereof does not exceed 100 nm. A via connected to the second semiconductor element and a via connected to a wiring provided on a lower-layer side thereof are easily and simultaneously formed by such a thickness.

Any one of a silicon element, a germanium element and a compound semiconductor element can be provided as the first semiconductor element and the second semiconductor element.

A MOSFET can be provided as the first semiconductor element.

An element formed by using a single-crystal semiconductor layer having a film thickness not exceeding 100 nm can be provided as the second semiconductor element. Since such an element has a pn joining area smaller than that of a transistor formed on a bulk substrate, the parasitic load capacity of the element can be largely reduced. The parasitic capacitance of the element is further reduced by using the above-mentioned joining layer (a so-called low-dielectric-constant film) as the interlayer insulating film provided under the single-crystal semiconductor layer constituting the element. As a result, device performance can be improved. Furthermore, the via connected to the second semiconductor element and the via connected to the wiring provided on the lower-layer side thereof are easily and simultaneously formed.

A MOSFET and a 1T-DRAM can be provided as the second semiconductor element.

When the MOSFET is provided as the second semiconductor element, the first multilayer wiring layer can include a wiring layer disposed immediately below the MOSFET with the interlayer insulating film interposed therebetween. In such a structure, the threshold value of the MOSFET can be controlled by applying a potential to the wiring layer disposed immediately below the MOSFET. A high-dielectric film can be provided between the interlayer insulating film and the MOSFET to form the 1T-DRAM.

In the semiconductor device in accordance with the exemplary embodiment, a second multilayer wiring layer can be provided on the second semiconductor element, and the second multilayer wiring layer can include a copper wiring layer connected to the second semiconductor element. The first multilayer wiring layer can include a copper wiring layer connected to the first semiconductor element. A high-density wiring having high reliability can be formed by the structure using the copper wiring, and heat resistance at about 350° C. can be obtained.

Since the second semiconductor element can be formed with good adhesion on the substrate including the first semiconductor element in the exemplary embodiment, a device having high element density and high reliability can be formed. The parasitic capacitance due to the interlayer insulating film (joining layer) provided under the second semiconductor element can be reduced to improve element performance. Consequently, a device function and performance per chip area can be improved to enable the formation of a high-speed multifunctional LSI having low power consumption.

In the exemplary embodiment, a substrate in which an element is provided on a semiconductor single-crystal substrate or a SOI (Silicon on Insulator) substrate, a TFT (Thin film transistor) substrate, and a substrate for manufacturing liquid crystals can be used as the substrate that includes the first semiconductor element.

An insulating film (interlayer insulating film) capable of isolating between the wirings can be used as the insulating film that contains silicon, oxygen and carbon. In order to reduce the capacitance between the element and the wiring, and the capacitance between multilayer wirings connected to the element, the insulating film is desirably made of a material having a relative permeability lower than that of a silicon oxide film (relative permeability: 4.2).

The following approach can be used as a plasma CVD method used for forming the joining layer (interlayer insulating film). In the approach, for example, a gaseous raw material is continuously supplied into a reaction chamber under reduced pressure; the molecules of the raw material are excited by plasma energy; and a continuous film is formed on a substrate by a gas phase reaction, a substrate surface reaction, and the like.

Plasma obtained by supplying a rare gas such as He or Ar, and an inactive gas such as $N_2$ into a reaction chamber and igniting plasma can be used as plasma for the activation treatment.

Ionized Ar or the like with which the surface of a substrate can be irradiated while the ionized Ar is accelerated in an electric field can be used as an ion beam for the activation treatment.

An atom beam such as an Ar beam can be used as an atom beam for the activation treatment.

A method for planarizing irregularities which occur on the wafer surface during a multilayer wiring forming process by bringing the wafer surface into contact with a rotating polishing pad and polishing while running a polishing fluid over the wafer surface can be used as a CMP (Chemical Mechanical Polishing) method.

In the formation of the wiring, a barrier metal film can be provided so as to cover the side and bottom surfaces of the wiring in order to prevent the metal elements which constitute the wiring from diffusing into the interlayer insulating film or the lower layer. The barrier metal film can be formed by using a conductive material having barrier properties to a material which constitutes the wiring. When the wiring is composed of metal materials primarily composed of Cu, a high-melting metal, nitrides thereof, and the like, such as tantalum (Ta), tantalum nitride (TaN), titanium nitride (TiN) and tungsten carbonitride (WCN), or layered films thereof can be used.

An insulating barrier film to be described later can be formed on a Cu wiring. The insulating barrier film can prevent the oxidization of Cu and the diffusion of Cu into the insulating film, and can be utilized as an etching stop layer during processing. For example, a silicon carbide film (SiC film), a silicon carbonitride film (SiCN film), a silicon nitride film (SiN film), and the like can be used as such an insulating barrier film.

Hereinafter, suitable exemplary embodiments will be further described with reference to the drawings.

[First Exemplary Embodiment]

In the exemplary embodiment, a single-crystal silicon thin film is formed on a first substrate that includes a first semiconductor element, and a second semiconductor element using the silicon thin film as a channel is formed. Thereby, as shown in Examples to be described later, a structure in which a second semiconductor element (3D transistor) is provided in a multilayer wiring layer can be obtained, to enable improvement in element density, and reduction in parasitic capacitance and wiring delay.

In recent years, a device referred to as a FPGA (field programmable gate array) as the intermediate position between a gate array and a standard cell has been developed. The circuit construction of the device can be changed by a user after the completion thereof. Flexibility and low power consumption can be simultaneously achieved by applying the 3D transistor in accordance with the exemplary embodiment to the FPGA.

Hereinafter, the exemplary embodiment will be specifically described using the drawings.

As shown in FIG. 1(a), there is prepared a first substrate in which an interlayer insulating film 102 (multilayer wiring layer) that includes a multilayer wiring 103 is provided on a semiconductor device substrate 101. A semiconductor element (not shown) is formed on the semiconductor device substrate 101. The wiring of the uppermost surface is a copper wiring. When the copper wiring is exposed, the copper wiring is covered with an insulating barrier film (not shown). At this time, the insulating barrier film can be formed of SiN, SiCN or SiC.

Then, as shown in FIG. 1(b), a SiOC film is deposited as a joining layer 104. The composition (atomic number ratio) of the SiOC film is preferably between Si:O:C=1:1:0.5 and Si:O:C=1:1:3.5. When carbon (C) is too little, the density of a dangling bond is reduced, to reduce joining strength. Furthermore, the relative permeability of the SiOC film as the interlayer insulating film is also increased, and the parasitic capacitance is increased. When carbon (C) is excessive, heat resistance and film strength are reduced, which causes degassing and crack generation in a ULSI process, to complicate the use of the SiOC film as the interlayer insulating film. The SiOC film may contain a hydrogen atom. The SiOC film preferably has an unsaturated hydrocarbon group.

The joining layer 104 is preferably formed by a plasma CVD method in views of the controllability of a film thickness, heat resistance, and film stability after film formation.

It is preferable that the joining layer 104 has a relative permeability lower than that of a silicon oxide film and is classified into a low-dielectric insulating film having a relative permeability of about 2.4 to about 3. For example, Black Diamond (trade name), Aurora (trade name), Coral (trade name), MSQ (methylsilsesquioxane), and the like can be used.

A plasma polymerization film (organic polysiloxane film) formed by a plasma CVD method using an organic siloxane as a raw material gas can be used as the joining layer (SiOC film) 104. Such a plasma polymerization film not only has excellent adhesion as the joining layer but also can be suitably used as the interlayer insulating film of the ULSI.

For example, a cyclic organic siloxane represented by the following chemical formula (1) can be used as the organic siloxane of the raw material gas. Each of $R_1$ and $R_2$ in the formula is preferably any one of a methyl group, an ethyl group, a propyl group, an isopropyl group, a vinyl group and an allyl group. Particularly, any one of $R_1$ and $R_2$ is preferably an unsaturated hydrocarbon group such as a vinyl group or an allyl group. For example, a cyclic organic siloxane in which $R_1$ is a vinyl group and $R_2$ is an isopropyl group can be suitably used.

[Chemical Formula 1]

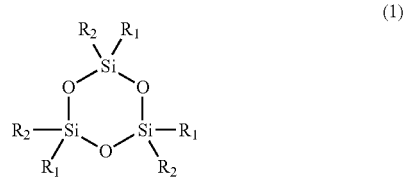

(1)

For example, the SiOC film can be formed as follows by the plasma CVD method using the organic siloxane as the raw material gas.

An organic siloxane material and an inactive gas are supplied to a reaction chamber. When the pressure of the reaction chamber is stabilized at a predetermined pressure, high-frequency (RF) power is applied to excite plasma, and thereby the film can be formed. He, Ne, Ar, and the like can be used as the inactive gas. Adhesiveness can be controlled by adjusting the flow rates of the raw material gas and the inactive gas during plasma excitation to change the partial pressure of the raw material gas. A lower-layer region and an upper-layer region having little carbon (C) and hydrogen (H) and high adhesiveness can be formed by setting the partial pressure of the raw material at the start and end of the plasma excitation to be lower than that during the film formation. The density of an intermediate region can be reduced to reduce the dielectric constant thereof. The desorption of a hydrocarbon component can be accelerated by adding an oxidized gas such as $O_2$ or $CO_2$ at the start and end of the plasma excitation, to improve the adhesiveness.

in FIG. 1(*c*), the surface of the joining layer (SiOC film) 104 is subjected to an activation treatment. For example, the surface can be activated by a plasma treatment, an ion beam treatment, an atom beam treatment and an ozone treatment. An impurity organic component in the surface of the film is removed by the activation treatment, and at the same time, a part of the elements in the surface of the film can be desorbed to form the dangling bond. When the density of the dangling bond in the surface of the film is high, the dangling bonds are subjected to a bonding reaction at the bonding of the substrates, and thereby high strength joining is obtained. The joining area can be increased by increasing irregularities of the surface of the film depending on the condition of the activation treatment, and furthermore, joining strength can be also improved. The joining layer contains not only Si and O but also carbon (C) as the component of the joining layer. Thereby, the density of the dangling bond at the activation treatment can be increased to improve the adhesiveness at the joining. Furthermore, the SiOC film contains the unsaturated hydrocarbon group, and thereby, the density of the dangling bond can be further increased. At the same time, adhesive strength can be increased by a polymerization reaction.

Figure 2:
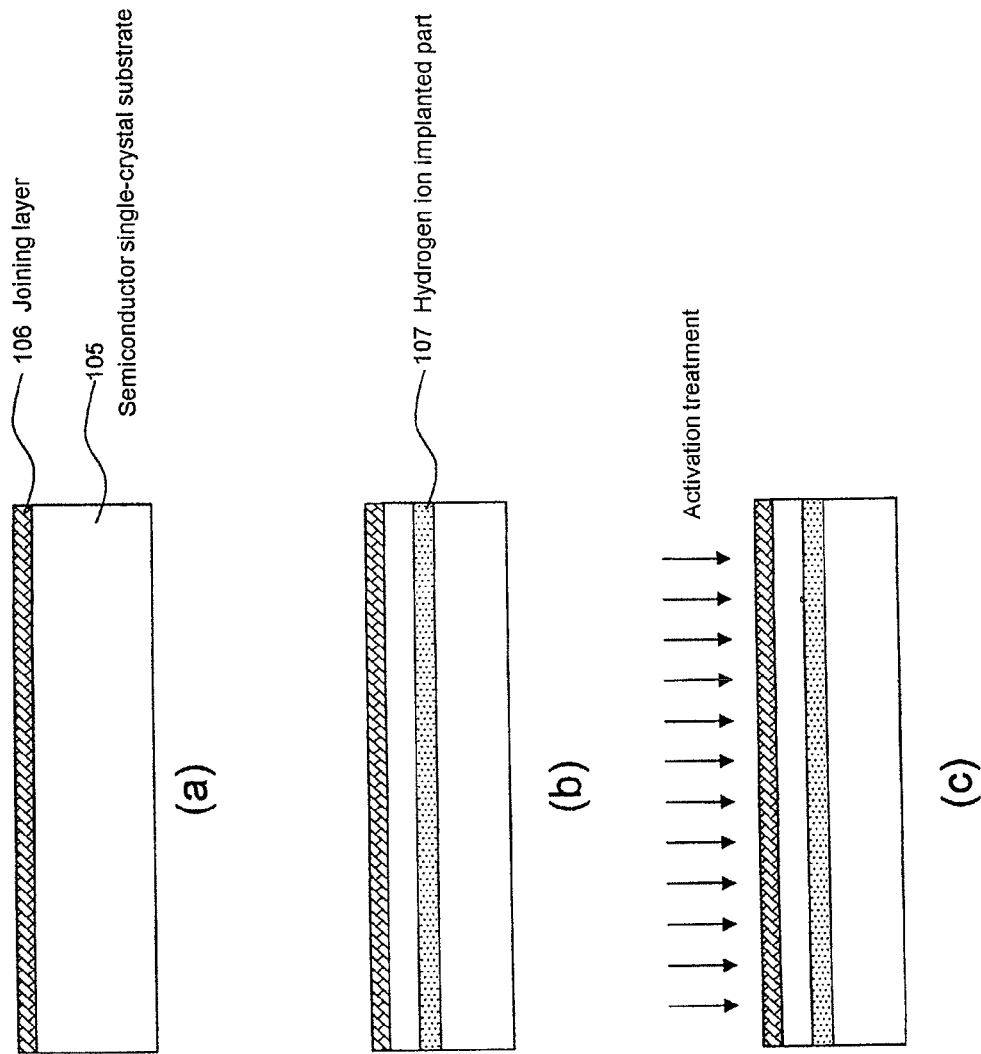
FIG. 2 is an explanatory view for explaining the method for manufacturing a semiconductor device in accordance with the first exemplary embodiment of the present invention.

On the other hand, as shown in FIG. 2(*a*), a semiconductor single-crystal substrate (second substrate) 105 suitable as a channel member of the second semiconductor element is prepared. The semiconductor single-crystal substrate is activated by implanting dopants. A SiOC film is similarly deposited as a joining layer 106 on the substrate. At this time, the joining layer 106 is preferably formed of the same material as that of the joining layer 104.

A silicon substrate, a germanium substrate, a compound semiconductor substrate, and the like can be used as the semiconductor single-crystal substrate. For example, when the silicon substrate is used, a MOSFET can be formed as the second semiconductor element. When a PMOS is formed, N type phosphor or the like can be previously doped into the substrate. When an NMOS is formed, P-type boron or the like can be previously doped into the substrate. When dopants are doped into the vicinity of the surface by ion implantation, the dopants may be activated, for example, at a high temperature of 900° C. or more after the ion implantation. Since the second substrate is not still bonded in this step, the second substrate can be activated at such a high temperature.

Next, as shown in FIG. 2(*b*), a hydrogen ion is implanted into the second substrate with a dose amount of $1.0 \times 10^{16}$ atm/cm$^2$ or more from the joining layer side, to form a high concentration hydrogen ion implanted part 107. The implanting condition at this time can be determined in views of both the film thickness of a semiconductor thin film to be transferred to the first substrate side and a heating temperature for generating hydrogen bubbles.

Subsequently, as shown in FIG. 2(*c*), the surface of the joining layer 106 provided on the second substrate is subjected to the activation treatment as in the above-mentioned activation treatment.

Figure 3:
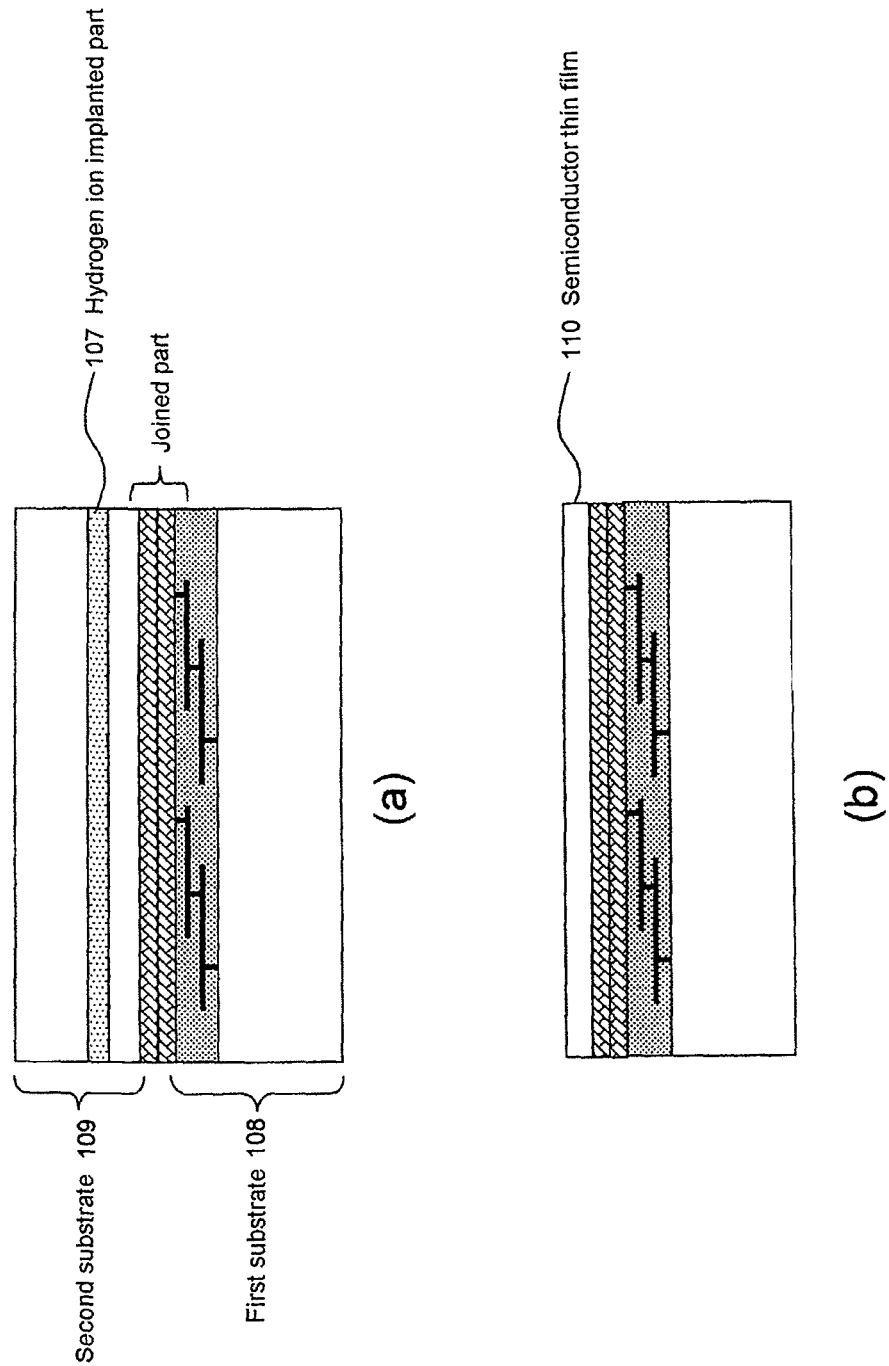
FIG. 3 is an explanatory view for explaining the method for manufacturing a semiconductor device in accordance with the first exemplary embodiment of the present invention.

Next, as shown in FIG. 3(*a*), the first substrate 108 and the second substrate 109 are press-bonded with a load of 40 kN or less in a vacuum, and preferably with a load of 20 kN or less. The pressure at this time can be appropriately adjusted corresponding to the kind and material of the substrate to be press-bonded. When the temperature at the press-bonding is too high, bubbles caused by the implanted hydrogen ion are generated, and accordingly the warpage of the substrate is generated. Hence, the first substrate 108 and the second substrate 109 are desirably press-bonded at a temperature of 200° C. or less. After both the substrates are subjected to the activation treatment, the substrates are preferably press-bonded without exposure to atmospheric air.

Next, as shown in FIG. 3(*b*), the bonded substrates are heated at 250 to 350° C., and hydrogen bubbles are generated. The second substrate is delaminated on the basis of the embrittled hydrogen ion implanted part to leave (transfer) a semiconductor thin film 110 on the joining layer provided on the first substrate.

The film thickness of the semiconductor thin film 110 can be arbitrarily adjusted according to the implanting condition of the hydrogen ion. The arbitrary film thickness of the joining layer provided under the semiconductor thin film 110 can be also obtained by appropriately adjusting the film thickness of the joining layer deposited on each of the substrates.

Next, the surface of the semiconductor thin film 110 is planarized by CMP, and the thickness thereof is adjusted. Since the semiconductor thin film 110 and the base substrate (first substrate) are firmly joined with the SiOC film interposed therebetween, film peeling is suppressed, and the surface of the semiconductor thin film 110 can be easily planarized by the CMP. The peeling of the outer periphery of the substrate can be prevented by previously removing the semiconductor thin film of the outer periphery of the substrate (a bevel part of a wafer) by dry etching, and thereafter performing the CMP.

The semiconductor thin film 110 (silicon thin film) formed as described above can be utilized as the channel part of the MOSFET as the second semiconductor element.

The forming temperature of the second semiconductor element is desirably 350° C. or less in order to prevent the degradation of the lower-layer side semiconductor device and wiring. For example, when a silicon transistor is formed, a gate insulating film can be formed by using a plasma oxidation method. An oxidation gas such as $O_2$ or $N_2O$ into which a rare gas such as He, Ar or Xe is added can be used for a plasma oxidation gas. The gate insulating film having a low interface state density (Dit) can be formed even at a low temperature of 350° C. or less by appropriately selecting a plasma condition and a gas kind. A schottky source/drain can be formed under a low temperature condition of 350° C. or less by applying Pt silicide or Er Silicide capable of being formed at, for example, 350° C. or less to a source/drain.

A thermally-oxidized film (relative permeability: about 3.9) is provided as a BOX film under the semiconductor channel in a SOI device. However, in the exemplary embodiment, a SiOC film (joining layer) having a low relative permeability of 3 or less is provided under the channel part of the second semiconductor element. Thereby, the parasitic capacitance between the drain of the transistor and the base substrate can be reduced, and the transistor performance can be improved.

The second semiconductor element formed as described above can be connected to the first semiconductor element previously formed on the first substrate, by the multilayer wiring.

[Second Exemplary Embodiment]

In the exemplary embodiment, a compound semiconductor thin film is formed on a first substrate that includes a first semiconductor element, and a second semiconductor element is formed by using the compound semiconductor thin film. Thereby, a structure in which the second semiconductor element is provided in a multilayer wiring layer can be obtained as in the first exemplary embodiment except that the element is formed by using the compound semiconductor thin film. An RF device in which an RF element is provided on a CMOS can be provided by using the second semiconductor element as the RF element. The second semiconductor element is applied to a semiconductor device such as a microcomputer, and thereby a chip size can be reduced and low power consumption can be achieved while requirement such as high power or high frequency operation can be fulfilled.

Hereinafter, an example in which an RF element is provided on a CMOS device substrate will be described using the drawings.

First, a first substrate is prepared. In the first substrate, an interlayer insulating film (multilayer wiring layer) that includes a multilayer wiring is provided on a semiconductor device substrate provided with a CMOS structure. A copper wiring exposed to an uppermost surface is covered with an insulating barrier film. A SiOC film is then deposited as a joining layer in the same manner as in the first exemplary embodiment, and is subjected to an activation treatment.

On the other hand, a compound semiconductor which contains dopants and activated is prepared as a second substrate. The compound semiconductor is suitable as an element member. A group II-IV compound semiconductor, a group III-V compound semiconductor and a group III-V nitride semiconductor can be used for the compound semiconductor. Specific examples thereof include a compound semiconductor primarily composed of GaAs, InP, GaN, and the like.

Figure 4:
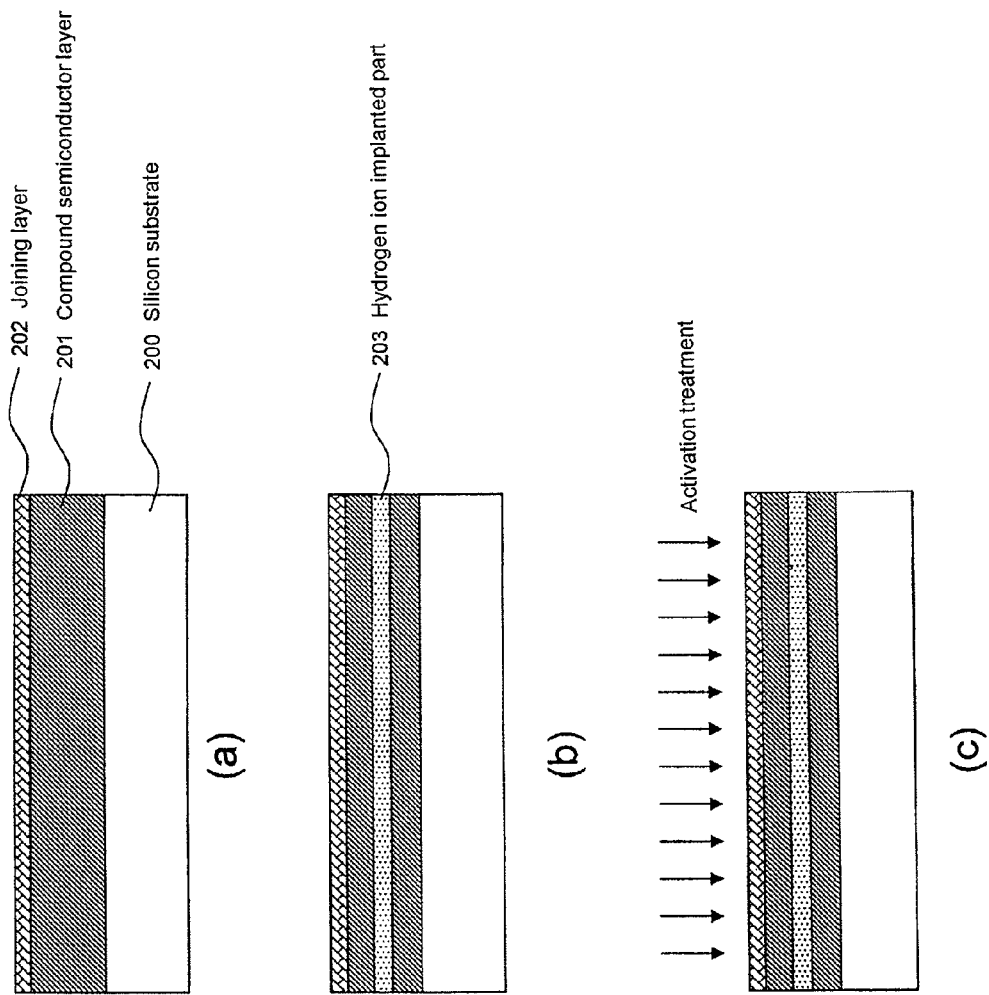
FIG. 4 is an explanatory view for explaining a method for manufacturing a semiconductor device in accordance with a second exemplary embodiment of the present invention.

The compound semiconductor single-crystal substrate itself may be used as the second substrate. However, when a wafer having a large diameter such as a 200 mm wafer or a 300 mm wafer is used, as shown in FIG. 4(*a*), a compound semiconductor layer 201 epitaxially grown on a silicon substrate 200 can be used. In this case, dopants may be contained by ion implantation, or the dopants may be doped by in-situ during the growth of the compound semiconductor layer. For example, when GaN is used, silicon can be used for n type doping, and Mg or the like can be used for p type doping. Since a second semiconductor substrate is not still bonded in this step, the dopants can be activated at a high temperature of 700° C. or more. The compound semiconductor layer may be a laminated body. For example, in the case of the nitride semiconductor, an AlGaN layer and a GaN layer may be laminated.

A SiOC film 202 is then deposited as the joining layer on the surface of a substrate as in the first substrate.

Next, as shown in FIG. 4(*b*), a hydrogen ion is implanted into a nitride semiconductor layer of the second substrate with a dose amount of $5.0 \times 10^{16}$ atm/cm$^2$ or more from the joining layer side, to form a high concentration hydrogen ion implanted part 203. At this time, the high concentration hydrogen ion implanted part may be formed in the compound semiconductor layer 201, or may be formed in a silicon substrate as a support.

Next, the surface of the SiOC film 202 is subjected to the activation treatment as in the above-mentioned activation treatment.

Figure 5:
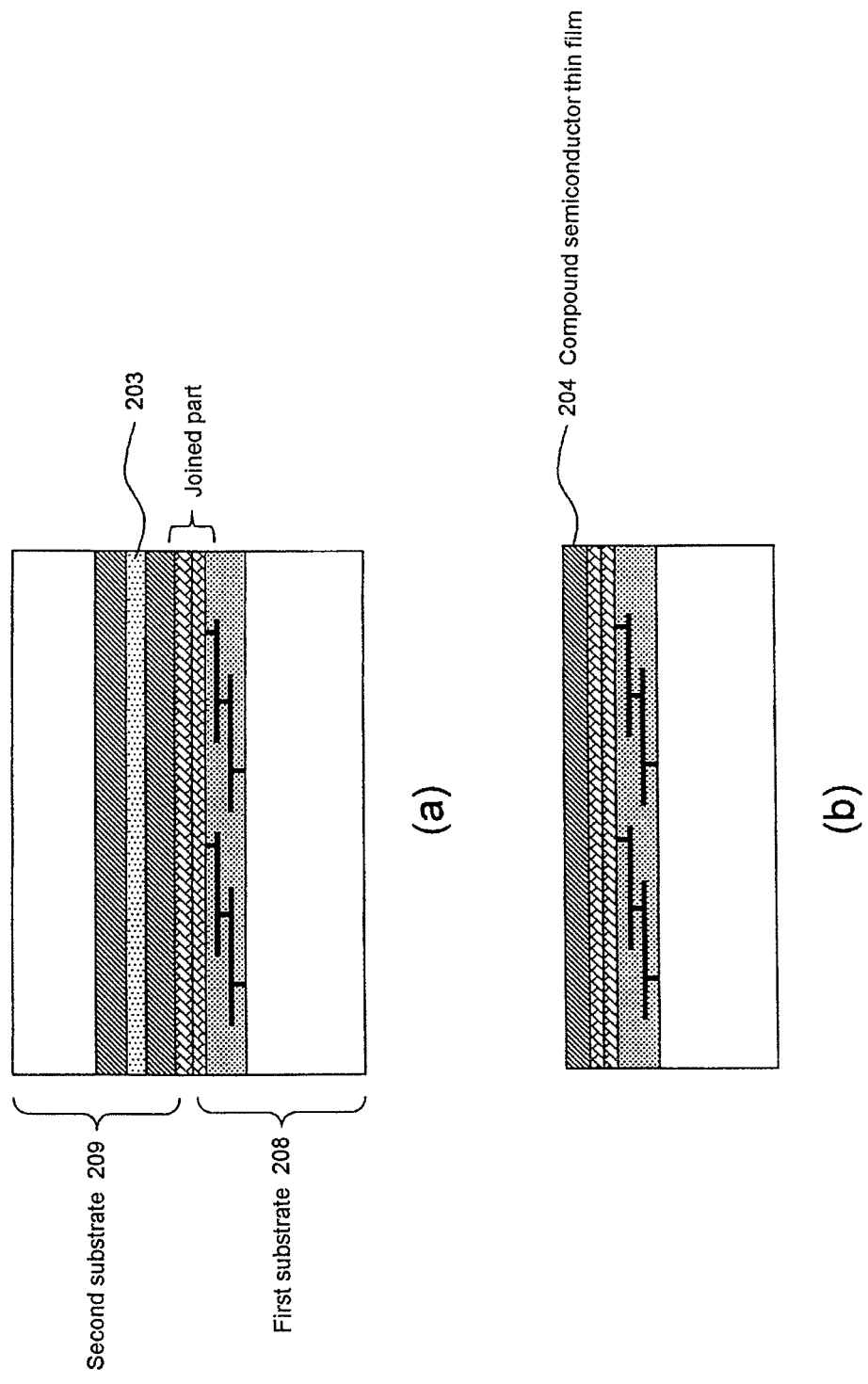
FIG. 5 is an explanatory view for explaining the method for manufacturing a semiconductor device in accordance with the second exemplary embodiment of the present invention.

Next, as shown in FIG. 5(*a*), a first substrate 208 and a second substrate 209 are press-bonded with a load of 40 kN or less in a vacuum, and preferably with a load of 20 kN or less. When the temperature at the press-bonding is too high, bubbles caused by the implanted hydrogen ion are generated, and accordingly the warpage of the substrate is generated. Hence, the first substrate 208 and the second substrate 209 are desirably press-bonded at a temperature of 200° C. or less. After both the substrates are subjected to the activation treatment, the substrates are preferably press-bonded without exposure to atmospheric air.

Next, as shown in FIG. 5 (*b*), the bonded substrates are heated at 250 to 350° C., and hydrogen bubbles are generated. The second substrate is delaminated on the basis of the embrittled hydrogen ion implanted part to leave (transfer) a compound semiconductor thin film 204 on the joining layer provided on the first substrate.

The film thickness of the compound semiconductor thin film 204 can be arbitrarily adjusted according to the implanting condition of the hydrogen ion. The arbitrary film thickness of the joining layer provided under the compound semiconductor thin film can be also obtained by appropriately adjusting the film thickness of the joining layer deposited on each of the substrates.

Next, the surface of the compound semiconductor thin film 204 is planarized by CMP, and the thickness thereof is adjusted. Since the compound semiconductor thin film 204 and the base substrate (first substrate) are firmly joined with the SiOC film interposed therebetween, the film peeling of the compound semiconductor thin film 204 is suppressed, and the surface of the compound semiconductor thin film 204 can be easily planarized by the CMP.

The compound semiconductor thin film 204 formed as described above can be used as a member of a HFET (hetero-junction field effect transistor), a MODFET (modulation dopedfield effect transistor) and the like as the second semiconductor element.

The forming temperature of the compound semiconductor element is desirably 350° C. or less in order to prevent the degradation of the lower-layer side semiconductor device and wiring. AlN, $Al_2O_3$ and the like can be used for a gate insulating film. A chlorine-based gas such as $BCl_3$ or $CCl_4$ is used for an etching process. For example, an etching rate of about 50 to about 80 nm/min is obtained for GaN. Since the work function of Al is almost equal to that of GaN regarding the joining of GaN and metal, ohmic features for n type are obtained by only the joining of Al. Pt, Pd, Pt/Ti/Al and the like can be used for schottky joining used for a MESFET (metal-semiconductor field effect transistor).

EXAMPLES

Hereinafter, the present invention will be further explained with reference to Examples.

Example 1

An example in which a silicon MOSFET as a first semiconductor element is formed on a first substrate and a silicon PMOSFET as a second semiconductor element is formed will be described as Example 1.

Figure 6:
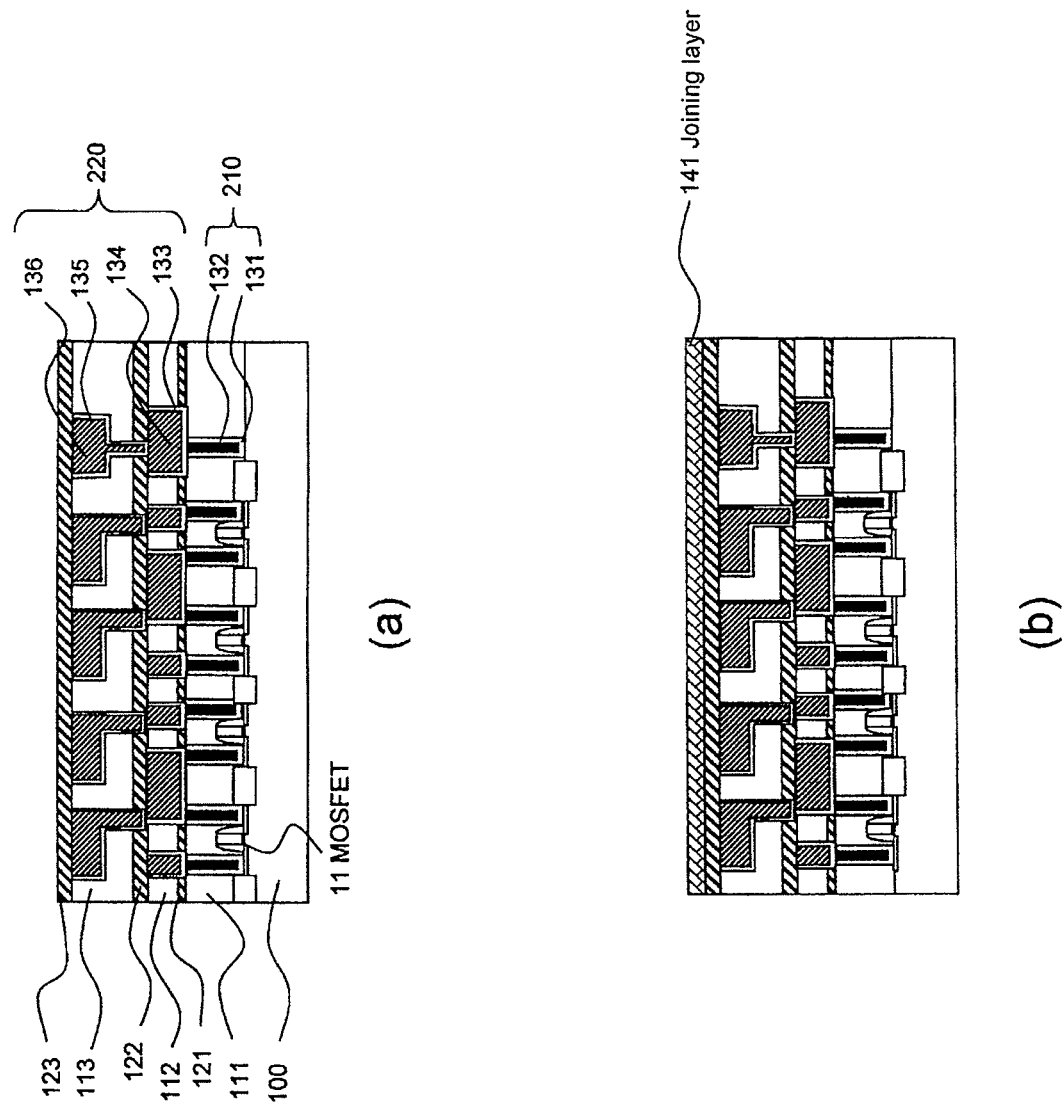
FIG. 6 is an explanatory view for explaining a method for manufacturing a semiconductor device in accordance with Example 1 of the present invention.

First, a first substrate shown in FIG. 6(a) was prepared. In the first substrate, a MOSFET 11 is formed on a silicon substrate 100. The MOSFET is connected to a copper wiring in a multilayer wiring layer 220 through a contact plug 210 made of a TiN film 131 and a tungsten plug 132. The contact plug 210 is provided so as to pass through a silicon oxide film 111. The copper wiring is made of Cu 134 and Cu 136 as a wiring material, and barrier metals 133 and 135 surrounding Cu and having a thickness of 5 nm. A Ta/TaN laminated barrier metal is used as the barrier metal. As an interlayer insulating film of the multilayer wiring layer, SiCN films 121 to 123 and SiOCH films 112, 113 are alternately formed. The upper surface of the top layer copper wiring is covered with the SiCN film 123 (relative permeability: 4.9) having a thickness of 30 nm.

As shown in FIG. 6(b), a SiOC film 141 that contains an unsaturated hydrocarbon group, the SiOC film having a thickness of 50 nm, was deposited as a joining layer on the above-mentioned first substrate by a plasma CVD method. A gasified cyclic organic siloxane ($R_1$ is a vinyl group, and $R_2$ is an isopropyl group) represented by the above-mentioned chemical formula (1) was used as a raw material gas.

A plasma CVD device provided with a reaction chamber for a 200 mm wafer was used. The supply amount of the raw material gas was set to 60 sccm (standard $cm^3$/min). He was used as an inactive career gas. The supply amount thereof was set to 300 sccm. A substrate temperature was set to 350° C. The distance between electrodes was set to 10 mm. RF power to a showerhead was set to 90 W at 13.5 MHz. The total pressure of the reaction chamber was set to 2.7 Torr (360 Pa). As described above, the adhesiveness of the upper and lower surface sides of the film can be also raised by controlling a gas supply amount at the start and end of plasma excitation to change the partial pressure of the raw material.

The inclusion of the unsaturated hydrocarbon group in the SiOC film thus formed was confirmed with a Raman spectrum. The composition (atomic number ratio) of the film is Si:O:C=1:1:3.3. The inclusion of hydrogen was also confirmed. The relative permeability of the film measured at room temperature was 2.5.

Figure 7:
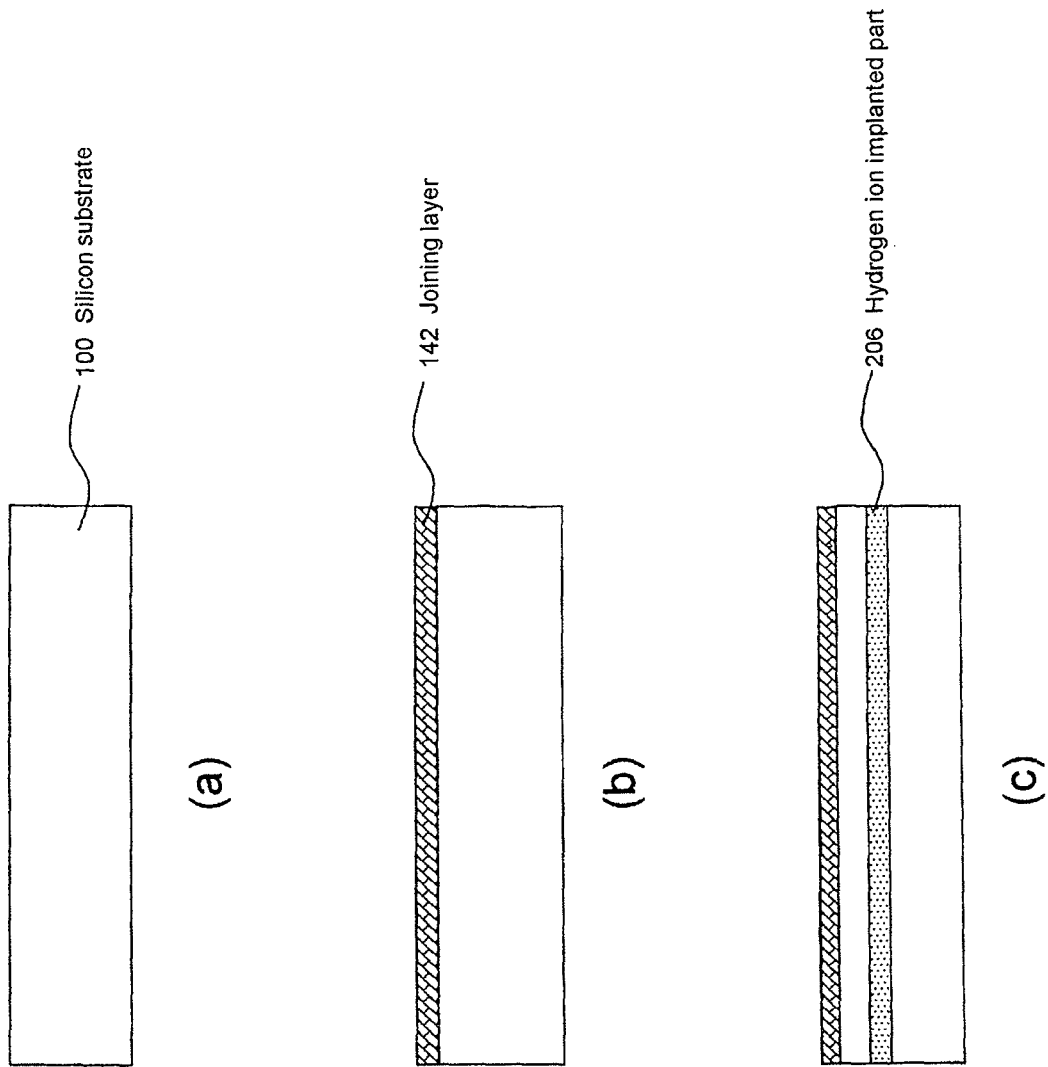
FIG. 7 is an explanatory view for explaining the method for manufacturing a semiconductor device in accordance with Example 1 of the present invention.

On the other hand, as shown in FIG. 7(a), an n type silicon substrate 100 into which phosphor was doped was used as the second substrate (resistivity: 1 to 10 Ω·cm). After the surface of the substrate was cleaned in an RCA process, a natural oxidized film was removed by 2% hydrofluoric acid (HF solution).

A SiOC film 142 that contains an unsaturated hydrocarbon group, the SiOC film having a thickness of 50 nm, was deposited on the surface of the second substrate (silicon substrate 100) by the plasma CVD method as in the first substrate.

Next, a hydrogen ion was implanted into the second substrate from the SiOC film side, to form a hydrogen ion implanted part 206. When the main orientation of the second semiconductor substrate (silicon substrate) at this time was (100), an implanting angle (an angle with respect to a direction perpendicular to a substrate plane) was set to 7 degrees. The hydrogen ion was implanted with a dose amount of $5 \times 10^{16}$ atm/$cm^2$ at 10 keV.

Next, before the first substrate 301 and the second substrate 302 are bonded together, the surface of the SiOC film provided on each of the substrates was irradiated with an Ar ion beam under reduced pressure of $10^{-3}$ Pa or less to subject the surface to an activation treatment.

Next, as shown in FIG. 8(a), the first substrate 301 and second substrate 302 were disposed so as to oppose each other. Subsequently, as shown in FIG. 8(b), the SiOC films were joined together, and a load of 20 kN or less was applied to the SiOC films at normal temperature to press-bond the SiOC films.

Herein, there will be described evaluation results obtained by measuring the adhesive strength of a joining interface when the SiOC film that contains the unsaturated hydrocarbon group in accordance with Example 1 is used as the joining layer, and the adhesive strength of a joining interface when a silicon oxide film deposited by the plasma CVD method is used as the joining layer.

The substrates bonded together with the joining layer interposed therebetween were cut into 12 mm square by using a dicer. The joined sample after dicing was subjected to IR observation. The IR observation confirmed no delamination caused by dicing. Then, the diced joined sample was adhesively fixed to a tensile testing jig by using an adhesive (trade name: Araldite), to evaluate joining strength. When the substrates were joined by the silicon oxide film, the average value of the joining strengths was 11.7 MPa. By contrast, when the substrates were joined by the SiOC film in accordance with Example 1, a high value of 16.8 MPa was obtained. When the silicon oxide film was used, a delaminated surface was a joined surface. By contrast, when the SiOC film in accordance with Example 1 was used, delamination between the tensile testing jig and an adhesive surface was confirmed. This shows that the SiOC film in accordance with Example 1 is excellent as a material joining the substrates.

Substrates were similarly joined except for irradiating with an Ar atom beam in place of the Ar ion beam to perform an activation treatment and applying no load. When the substrates were attempted to be joined by the silicon oxide film, the substrates could not be joined. By contrast, when the substrates were joined by the SiOC film in accordance with Example 1, high joining strength of 11 MPa on an average was obtained. This also shows that the SiOC film in accordance with Example 1 is excellent as a material for joining the substrates.

Regarding the activation treatment irradiating with the Ar atom beam, for example, a desired condition can be adjusted with reference to Non-Patent Literature 1.

Figure 9:
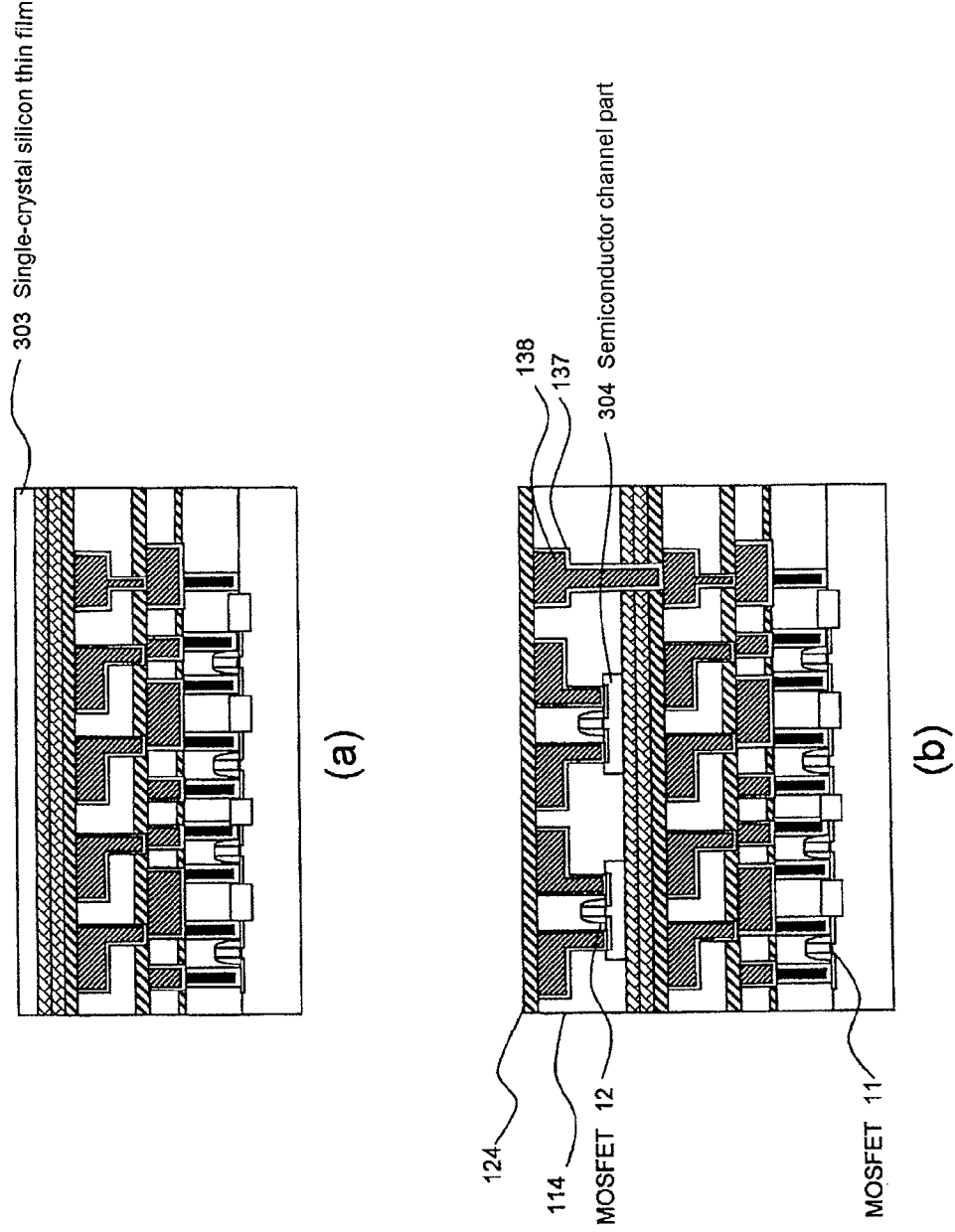
FIG. 9 is an explanatory view for explaining the method for manufacturing a semiconductor device in accordance with Example 1 of the present invention.

Next, a heat treatment was performed in a nitrogen atmosphere at 350° C. for 24 hours. A single-crystal silicon thin film 303 was then delaminated from the second substrate side with the embrittled hydrogen ion implanted part as a starting point by applying an external impact. As shown in FIG. 9(*a*), the single-crystal silicon thin film 303 was transferred on the first substrate with the joining layer interposed therebetween. A heat treatment time can be appropriately selected in views of both an injection rate and a heat treatment temperature.

Next, the surface of the single-crystal silicon thin film 303 transferred on the first substrate was planarized by using a CMP method.

Next, after the surface of the single-crystal silicon thin film 303 was subjected to RCA cleaning, an oxide film on the silicon surface was removed by using 2% dilute hydrofluoric acid. At this time, a SiOC insulating film may be exposed without transferring the single-crystal silicon thin film on the peripheral part and side surface of the wafer. However, since the SiOC film used in Example 1 contains carbon (C), the dissolution of the SiOC film into the dilute hydrofluoric acid can be prevented. When the silicon oxide film is used as a joining material, side etch is generated in the lower surface side portion of the single-crystal silicon thin film in the outer peripheral part of the wafer by the hydrofluoric acid processing. The side etch causes delamination, and increases particles in the later process.

Next, a gate oxide film was deposited on the single-crystal silicon thin film 303 by a plasma oxidation process. At this time, plasma oxidation was performed at 350° C. or less by using an oxygen/Ar mixed gas.

Next, a desired place was processed to a semiconductor channel part 304 from the single-crystal silicon thin film 303 by using a photolithographic technique and a reactive dry etching technique. A parallel plate type dry etching device was used for reactive dry etching. Conditions of $CF_4/Ar=25$:50 sccm, 4 mTorr (0.533 Pa), a source: 400 W, and a substrate bias: 90 W were used.

Next, a gate electrode and a sidewall were formed. A metal gate such as Ta, Ti, TaN and TaAlN, or a poly-germanium electrode or the like deposited at 350° C. or less can be used for the gate electrode. Pt was deposited on a source/drain portion. After a heat treatment at 350° C., the redundant Pt was removed by aqua regia.

Figure 10:
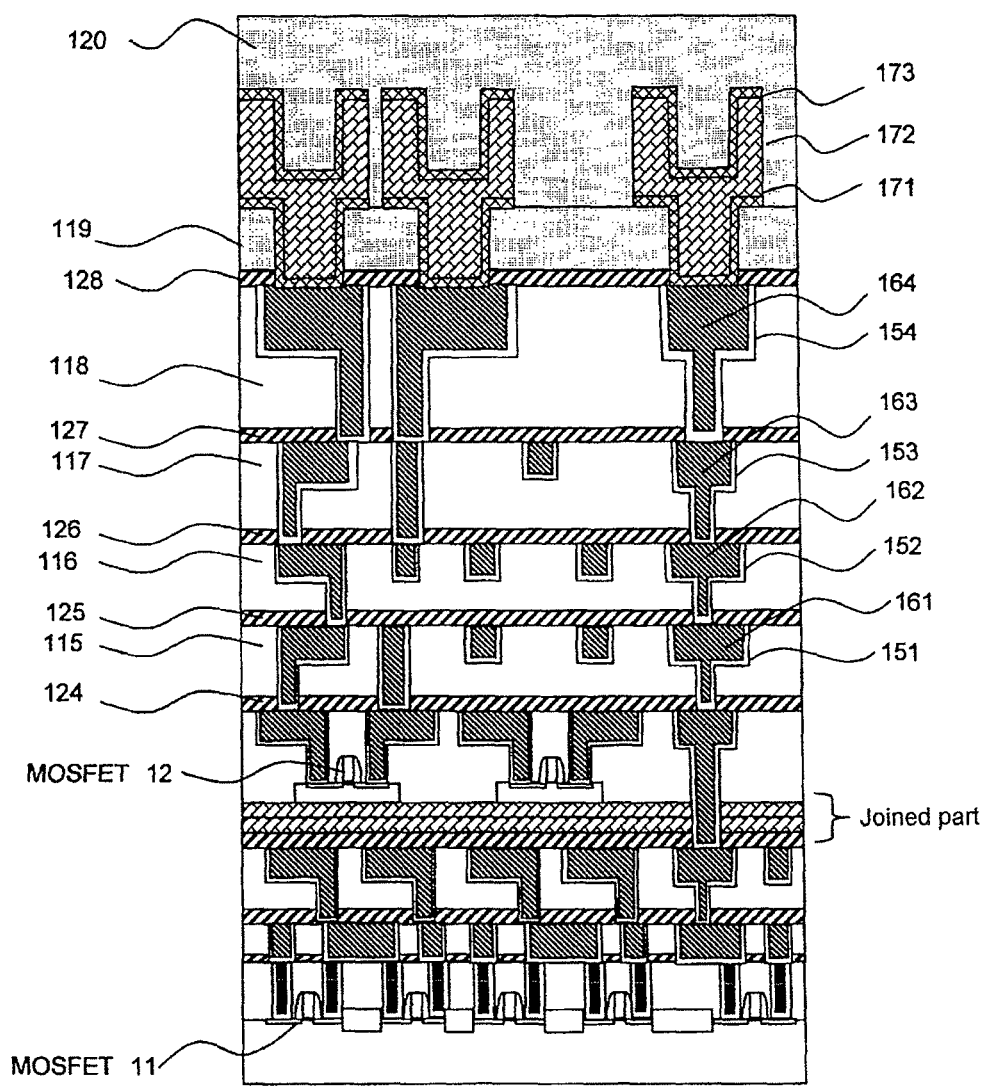
FIG. 10 is an explanatory view for explaining the method for manufacturing a semiconductor device in accordance with Example 1 of the present invention.

Next, as shown in FIG. 9(*b*), the formed silicon PMOSFET was covered with the interlayer insulating film (SiCOH film) 114, to form a copper wiring made of a barrier metal 137 and Cu 138. The wiring forming process was repeated two or more times, to form a multilayer wiring layer that includes a wiring layer connected to the MOSFET provided on the first substrate, and a wiring layer connected to the second semiconductor element (silicon PMOSFET). As a result, a device shown in FIG. 10 was completed. In this copper wiring process, a general copper multilayer wiring process, which includes ArF exposure or KrF exposure and dry etching, was used. The multilayer wiring layer includes SiCN interlayer insulating films 124 to 128, SiOCH interlayer insulating films 115 to 118, and a wiring made of Ta/TaN barrier films 151 to 154 and Cu conductive materials 161 to 165. An interlayer insulating film made of a silicon oxide film 119 was formed on the multilayer wiring layer. An upper-layer wiring made of Ti/TiN films 171 and 173 and an Al—Cu conductive material 172 was formed so as to pass through the interlayer insulating film and connect to a lower-layer side Cu wiring. A silicon oxynitride film 120 was provided so that the upper-layer wiring is covered.

The second semiconductor element thus produced was formed without deteriorating the characteristics of the first semiconductor element. It was confirmed that the $I_{on}/I_{off}$ ratio of the second semiconductor element (silicon PMOSFET) was a sufficiently high value of $10^9$ or more, and the hole mobility thereof was a sufficiently high value of 150 $cm^2/Vs$.

Example 2

In this example, a silicon MOSFET as a first semiconductor element is formed on a first substrate, a silicon MOSFET as a second semiconductor element is formed, and the threshold value of the silicon MOSFET is controlled by utilizing a lower-layer side copper wiring. This example will be explained with reference to FIG. 11.

Figure 11:
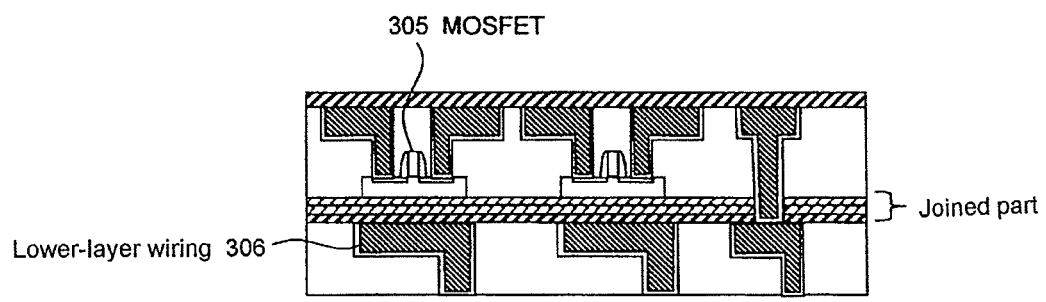
FIG. 11 is an explanatory view for explaining a semiconductor device in accordance with Example 2 of the present invention.

FIG. 11 is a partial sectional view of the periphery of the second semiconductor element. Example 2 has the same structure as that of Example 1 except that the lower-layer copper wiring 306 is disposed immediately below a MOSFET 305 which is the second semiconductor element with a SiOC film (joining layer) interposed therebetween. The threshold value of the MOSFET can be arbitrarily controlled by applying a voltage (back bias) to the lower-layer copper wiring 306.

Example 3

In this example, a silicon MOSFET as a first semiconductor element is formed on a first substrate, a silicon MOSFET as a second semiconductor element is formed, electric charges are accumulated by utilizing an insulating film part provided under the MOSFET as BOX, and this structure can be operated as a DRAM. This example will be explained below. A capacitorless 1T-DRAM is a volatile memory utilizing a so-called floating body effect of a SOI-MOSFET, and senses the size of the amount of many carriers accumulated in a floating body part as change of a threshold value. For example, when an N type MOSFET is used, the threshold value is decreased by the increase of a body voltage in a state where holes are accumulated. As a result, a large drain current flows. On the other hand, the threshold value is increased by the decrease of the body voltage in a state where the holes are lacking, and the drain current is reduced. A writing method can be performed by passing an impact ionization current and a GIDL current.

Figure 12:
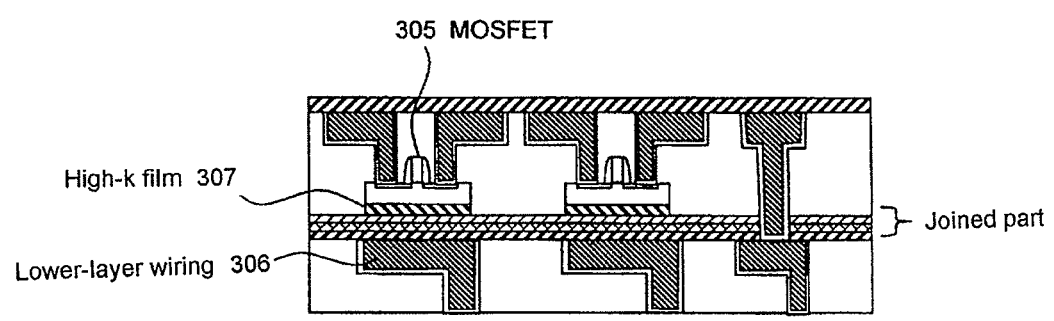
FIG. 12 is an explanatory view for explaining a semiconductor device in accordance with Example 3 of the present invention.

FIG. 12 is a partial sectional view of the periphery of the second semiconductor element. Example 3 has the same structure as that of Example 1 except that a lower-layer copper wiring 306 is disposed immediately below a MOSFET 305 which is the second semiconductor element with a high-dielectric (High-k) film 307 and a SiOC film (joining layer) interposed therebetween. The high-dielectric (High-k) film 307 can be inserted between the MOSFET 305 and the SiOC film. The high-dielectric film can be provided on the lower surface of the MOSFET 305 by depositing the SiOC film (joining layer) after depositing the high-dielectric film 307 on the second substrate. A $HfO_2$ film formed by an ALD (atomic layer deposition) method was used as the high-dielectric film. A $HfSiO_2$ film, a $HfO_2/La_2O_3$ laminated film, a $HfO_2/SiO_2$ laminated film and the like in addition to the $HfO_2$ film can be used as the high-dielectric film. The MOSFET 305 can be utilized as a 1T-DRAM transistor by such a constitution.

The present invention described above can be applied to a joining method that requires adhesiveness having high strength under a low temperature condition when the first substrate and second substrate are joined together, and also applied to a technique related to the element formed by utilizing the joining method. The applicable scope thereof is in no way limited.

The present invention was explained with reference to the above-mentioned suitable exemplary embodiments and Examples. However, these exemplary embodiments and Examples are described for explaining the suitable example of the present invention, and the present invention is not limited to the exemplary embodiments and Examples.

As described above, the examples in which the semiconductor thin film is transferred on the device substrate in relation to a semiconductor device having CMOS circuits was described. However, the present invention is not limited thereto. For example, the present invention can be also applied to the joining of device substrates; the joining of device chips; the lamination (joining) of semiconductor products having memory circuits such as DRAM (Dynamic Random Access Memory), SRAM (Static Random Access Memory), flash memory, FRAM (Ferro electric Random Access Memory), MRAM (Magnetic Random Access Memory), resistance random access memory and a bipolar transistor; the lamination (joining) of semiconductor products having logical circuits such as a microprocessor; or the lamination (joining) of consolidated semiconductor devices which employ some of the above-mentioned circuits simultaneously. The present invention can be also applied to cases where electronic circuit devices, optical circuit devices, quantum circuit devices, micro-machines, MEMS (Micro Electro Mechanical Systems) and the like are bonded to semiconductor devices.

The product manufactured by using the joining method of the substrate in accordance with the present invention can be investigated, to confirm the presence or absence of the use thereof. Specifically, first, the TEM observation of the section of the device confirms whether the semiconductor film is formed in the multilayer wiring layer or on the multilayer wiring layer. When the semiconductor film is formed, the element of the composition of the insulating film located on the lower surface of the semiconductor film is analyzed by EDX, EELS and the like in addition to TEM. The insulating film can be specified by detecting Si, O and C. Alternatively, the section of the place presumed that the substrates are connected is similarly observed by TEM, and the element thereof is analyzed. Thereby, it can be specified whether the material of the joining interface depends on the present invention. A small amount of SUS components (Fe, Cr and the like) may adhere to the joining interface from the inside of the chamber during the ion beam treatment, to affect the joining interface. However, when the SiOC film in accordance with the present invention is used, sufficient joining is obtained regardless of the amount of adhesion. When the surface is subjected to the activation treatment, the amount of carbon is decreased as compared with the inside of the SiOC film. Thereby, the joining interface can be identified by the contrast of the TEM image, and it can be confirmed whether the joining approach in accordance with the present invention is used.

Having thus described the present invention with reference to the exemplary embodiments and examples, the Present invention is not limited to the above-described exemplary embodiments and examples. Various modifications understandable to those skilled in the art may be made to the constitution and details of the present invention within the scope thereof.

The present application claims the right of priority based on Japanese Patent Application No. 2009-40965, filed on Feb. 24, 2009, the entire content of which is incorporated herein by reference.

REFERENCE SIGNS LIST

| | |
|---|---|
| 11 | MOSFET |
| 12 | MOSFET |
| 100 | silicon substrate (semiconductor substrate) |
| 101 | semiconductor device substrate |
| 102 | interlayer insulating film |
| 103 | multilayer wiring |
| 104 | joining layer |
| 105 | semiconductor single-crystal substrate |
| 106 | joining layer |
| 107 | hydrogen ion implanted part |
| 108 | first substrate |
| 109 | second substrate |
| 110 | semiconductor thin film |
| 111 | silicon oxide film |
| 112 to 118 | SiOCH film (interlayer insulating film) |
| 119 | silicon oxide film |
| 120 | silicon oxynitride film |
| 121 to 128 | SiCN film (interlayer insulating film) |
| 131 | TiN film |
| 132 | Tungsten plug |
| 133 | barrier metal |
| 134 | Cu wiring |
| 135 | barrier metal |
| 136 | Cu wiring |
| 137 | barrier metal |
| 138 | Cu wiring |
| 141 | joining layer |
| 142 | joining layer |
| 151 to 154 | Ta/TaN barrier film |
| 161 to 164 | Cu wiring |
| 171 | Ti/TiN film |
| 172 | Al-Cu wiring |
| 173 | Ti/TiN film |
| 200 | silicon substrate |
| 201 | compound semiconductor layer |
| 202 | joining layer |
| 203 | hydrogen ion implanted part |
| 204 | compound semiconductor thin film |
| 206 | hydrogen ion implanted part |
| 208 | first substrate |
| 209 | second substrate |
| 210 | contact plug |
| 220 | multilayer wiring layer |
| 301 | first substrate |
| 302 | second substrate |
| 303 | single-crystal silicon thin film |
| 304 | semiconductor channel part |
| 305 | MOSFET |
| 306 | lower-layer wiring |
| 307 | High-k film |

The invention claimed is:

1. A method for manufacturing a semiconductor device comprising:
   forming an insulating film comprising silicon, oxygen and carbon on at least one of a first substrate and a second substrate; and
   bonding the first substrate and the second substrate together, with the insulating film interposed therebetween,
   wherein the insulating film is formed by a plasma CVD method using an organic siloxane as a raw material gas, and the organic siloxane comprises a chain unsaturated hydrocarbon group.

2. The method for manufacturing a semiconductor device according to claim 1, wherein the first substrate and the second substrate are bonded together at a temperature not exceeding 200° C.

3. The method for manufacturing a semiconductor device according to claim 1, wherein a surface of the insulating film is subjected to an activation treatment before bonding the first substrate and the second substrate together.

4. The method according to claim 3, wherein the activation treatment is performed by any one of a plasma treatment, an ion beam treatment and an atom beam treatment.

5. The method for manufacturing a semiconductor device according to claim 1, wherein the first substrate comprises a semiconductor substrate or a semiconductor layer, and the second substrate comprises a semiconductor substrate or a semiconductor layer that is of the same kind as or of a different kind from the semiconductor substrate or the semiconductor layer of the first substrate.

6. The method for manufacturing a semiconductor device according to claim 5, wherein the first substrate comprises a first semiconductor element.

7. The method for manufacturing a semiconductor device according to claim 6, wherein the first substrate comprises a multilayer wiring layer provided on the first semiconductor element.

8. The method according to claim 1, wherein a first insulating film comprising silicon, oxygen and carbon is formed on the first substrate by a plasma CVD method using an organic siloxane comprising a chain unsaturated hydrocarbon group, a second insulating film comprising silicon, oxygen and carbon is formed on the second substrate by a plasma CVD method using an organic siloxane comprising a chain unsaturated hydrocarbon group, and the first substrate and the second substrate are bonded together, with the first and second insulating films interposed therebetween.

9. The method according to claim 1, wherein the chain unsaturated hydrocarbon group is a vinyl group.

10. The method according to claim 1, wherein the organic siloxane further comprises a six membered ring having three silicon atoms and three oxygen atoms.

11. The method according to claim 1, wherein the organic siloxane is a cyclic organic siloxane represented by the following chemical fomrula:

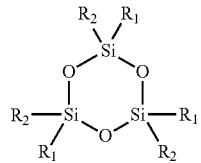

wherein $R_1$ and $R_2$ are each independently a methyl group, an ethyl group, a propyl group, an isopropyl group, a vinyl group, or an allyl group.

12. The method according to claim 1, wherein the first substrate and the second substrate are bonded together by applying a press-bonding load of 40 kN or less, under a reduced pressure of $10^{-3}$ Pa or less.

13. A method for manufacturing a semiconductor device comprising:

forming an insulating film comprising silicon, oxygen and carbon on at least one of a first substrate and a second substrate; and bonding the first substrate and the second substrate together, with the insulating film interposed therebetween, wherein the first substrate comprises a semiconductor substrate or a semiconductor layer, and the second substrate comprises a semiconductor substrate or a semiconductor layer that is of the same kind as or of a different kind from the semiconductor substrate or the semiconductor layer of the first substrate, the first substrate comprises a first semiconductor element, and the second substrate is removed with a part of the second substrate left on the insulating film as a semiconductor residual layer after bonding the first substrate and the second substrate together, and a second semiconductor element is formed by using the semiconductor residual layer.

14. A method for manufacturing a semiconductor device comprising:

forming an insulating film comprising silicon, oxygen and carbon on at least one of a first substrate and a second substrate; and bonding the first substrate and the second substrate together, with the insulating film interposed therebetween, wherein the first substrate comprises a semiconductor substrate or a semiconductor layer, and the second substrate comprises a semiconductor substrate or a semiconductor layer that is of the same kind as or of a different kind from the semiconductor substrate or the semiconductor layer of the first substrate, the first substrate comprises a first semiconductor element, and the method further comprises before bonding the first substrate and the second substrate together, implanting a hydrogen ion into the second substrate to form a hydrogen ion added layer;

after bonding the first substrate and the second substrate together, performing a heat treatment to embrittle the hydrogen ion added layer, thereby generating delamination in the embrittled portion, and separating the second substrate from the delaminated portion with a bonded surface side portion left as a semiconductor residual layer on the insulating film; and forming a second semiconductor element by using the semiconductor residual layer.

15. The method for manufacturing a semiconductor device according to claim 14, wherein the first substrate and the second substrate are bonded together at a temperature not exceeding 200° C., and the heat treatment is performed at a temperature of 250° C. or more and 400° C. or less.

16. A semiconductor device comprising:
a first semiconductor element on a substrate;
a first multilayer wiring layer provided on the first semiconductor element;
an interlayer insulating film comprising silicon, carbon and oxygen, the interlayer insulating film being provided over the first semiconductor element; and
a second semiconductor element provided on the interlayer insulating film, the second semiconductor element being located above the first semiconductor element.

17. The semiconductor device according to claim 16, wherein the interlayer insulating film is formed of an organic polysiloxane.

18. The semiconductor device according to claim 17, wherein the organic polysiloxane is a polysiloxane comprising an unsaturated hydrocarbon group.

19. The semiconductor device according to claim 16, wherein the first semiconductor element and the second semiconductor element are each any one of a silicon element, a germanium element and a compound semiconductor element.

20. The semiconductor device according to claim 16, wherein the second semiconductor element is an element formed by using a single-crystal semiconductor layer having a film thickness not exceeding 100 nm.

21. The semiconductor device according to claim 16, wherein the second semiconductor element is a MOSFET.

22. The semiconductor device according to claim 16, wherein a second multilayer wiring layer is provided on the second semiconductor element; the second multilayer wiring layer comprises a copper wiring layer connected to the second semiconductor element; and the first multilayer wiring layer comprises a copper wiring layer connected to the first semiconductor element.

23. A semiconductor device comprising:
a first semiconductor element;
a first multilayer wiring layer provided on the first semiconductor element;
an interlayer insulating film comprising silicon, carbon and oxygen, the interlayer insulating film being provided on the first multilayer wiring layer; and
a second semiconductor element provided on the interlayer insulating film,
wherein the second semiconductor element is a MOSFET, and
the first multilayer wiring layer comprises a wiring layer disposed immediately below the MOSFET with the interlayer insulating film interposed therebetween, such that a threshold value of the MOSFET can be controlled by applying a potential to the wiring layer.

24. A semiconductor device comprising:
a first semiconductor element;
a first multilayer wiring layer provided on the first semiconductor element;
an interlayer insulating film comprising silicon, carbon and oxygen, the interlayer insulating film being provided on the first multilayer wiring layer; and
a second semiconductor element provided on the interlayer insulating film,
wherein the second semiconductor element is a MOSFET, and
the first multilayer wiring layer comprises a wiring layer disposed immediately below the MOSFET with the interlayer insulating film interposed therebetween, and a high-dielectric film is provided between the interlayer insulating film and the MOSFET.

25. A method for manufacturing a semiconductor device comprising:
forming an insulating film comprising silicon, oxygen and carbon on at least one of a first substrate and a second substrate; and
bonding the first substrate and the second substrate together, with the insulating film interposed therebetween,
wherein the insulating film is formed by a plasma CVD method using an organic siloxane as a raw material gas, and
the organic siloxane is a cyclic organic siloxane.

26. The method according to claim 25 wherein the cyclic organic siloxane comprises a six membered ring having three silicon atoms and three oxygen atoms.

27. The method according to claim 25, wherein the cyclic organic siloxane is represented by the following chemical formula:

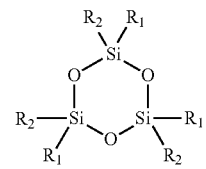

wherein $R_1$ and $R_2$ are each independently a methyl group, an ethyl group, a propyl group, an isopropyl group, a vinyl group, or an allyl group.

28. The method according to claim 25, wherein a first insulating film comprising silicon, oxygen and carbon is formed on the first substrate by a plasma CVD method using a cyclic organic siloxane,
a second insulating film comprising silicon, oxygen and carbon is formed on the second substrate by a plasma CVD method using a cyclic organic siloxane, and
the first substrate and the second substrate are bonded together, with the first and second insulating films interposed therebetween.

29. The method according to claim 25, wherein the first substrate and the second substrate are bonded together at a temperature not exceeding 200° C.

30. The method according to claim 25, wherein a surface of the insulating film is subjected to an activation treatment before bonding the first substrate and the second substrate together.

31. The method according to claim 30, wherein the activation treatment is performed by any one of a plasma treatment, an ion beam treatment and an atom beam treatment.

32. The method according to claim 25, wherein the first substrate and the second substrate are bonded together by applying a press-bonding load of 40 kN or less, under a reduced pressure of $10^{-3}$ Pa or less.

33. The method according to claim 25, wherein the first substrate comprises a semiconductor substrate or a semiconductor layer, and the second substrate comprises a semiconductor substrate or a semiconductor layer that is of the same kind as or of a different kind from the semiconductor substrate or the semiconductor layer of the first substrate.

34. The method according to claim 33, wherein the first substrate comprises a first semiconductor element.

35. The method according to claim 34, wherein the first substrate further comprises a multilayer wiring layer provided on the first semiconductor element.

* * * * *